United States Patent
Yajima et al.

(10) Patent No.: US 7,701,826 B2
(45) Date of Patent: Apr. 20, 2010

(54) OPTICAL DISK DRIVE WITH TEMPERATURE BASED CONTROL OF RF SUPERIMPOSED CURRENT

(75) Inventors: Masatoshi Yajima, Osaka (JP); Akihiro Sakaguchi, Osaka (JP)

(73) Assignee: Panasonic Corporation, Kadoma (JP)

( * ) Notice: Subject to any disclaimer, the term of this patent is extended or adjusted under 35 U.S.C. 154(b) by 441 days.

(21) Appl. No.: 11/718,453

(22) PCT Filed: Oct. 25, 2005

(86) PCT No.: PCT/JP2005/019594

§ 371 (c)(1),
(2), (4) Date: May 2, 2007

(87) PCT Pub. No.: WO2006/051688

PCT Pub. Date: May 18, 2006

(65) Prior Publication Data

US 2008/0094980 A1      Apr. 24, 2008

(30) Foreign Application Priority Data

Nov. 10, 2004   (JP) ............................. 2004-326183

(51) Int. Cl.
*G11B 11/00*   (2006.01)
(52) U.S. Cl. .................... 369/53.26; 369/116
(58) Field of Classification Search .............. None
See application file for complete search history.

(56) References Cited

U.S. PATENT DOCUMENTS

| 5,018,155 A | * | 5/1991 | Miyairi ..................... 372/31 |
| 5,625,616 A | * | 4/1997 | Koike et al. .............. 369/53.26 |
| 2002/0163946 A1 | | 11/2002 | Tanase |
| 2004/0223438 A1 | | 11/2004 | Kura et al. |
| 2005/0286392 A1 | | 12/2005 | Kamei |

FOREIGN PATENT DOCUMENTS

| JP | 03-025732 | 2/1991 |
| JP | 05-075192 | 3/1993 |
| JP | 07-093794 | 4/1995 |
| JP | 07-320292 | 12/1995 |
| JP | 2000-105941 | 4/2000 |

(Continued)

OTHER PUBLICATIONS

International Search Report for corresponding Application No. PCT/JP2005/019594 mailed Jan. 10, 2006.

(Continued)

*Primary Examiner*—Paul Huber
(74) *Attorney, Agent, or Firm*—Renner, Otto, Boisselle & Sklar, LLP

(57) ABSTRACT

An optical information read/write apparatus according to the present invention includes: a light source 1 that emits a laser beam to access an information storage medium optically; a laser driver 51a for supplying drive current to a semiconductor laser as the light source 1; an RE superimposed current generator 51c for adding RE superimposed current to the drive current; a temperature sensor 35 for detecting a temperature around the light source 1; and a control section for switching the values of the RE superimposed current according to the temperature detected.

9 Claims, 7 Drawing Sheets

FOREIGN PATENT DOCUMENTS

| | | |
|---|---|---|
| JP | 2001-056953 | 2/2001 |
| JP | 2002-319169 | 10/2002 |
| JP | 2004-253032 | 9/2004 |
| JP | 2004-288842 | 10/2004 |
| WO | 2004/038711 | 5/2004 |

OTHER PUBLICATIONS

Form PCT/ISA/237and concise explanation.

Extended European Search Report issued on Jul. 25, 2008 for corresponding European Patent Application No. 05799289.3.

European Official Communication for corresponding European Patent Application No. 05 799 289.3 dated Jul. 13, 2009.

* cited by examiner

OPTICAL DISK DRIVE WITH TEMPERATURE BASED CONTROL OF RF SUPERIMPOSED CURRENT

TECHNICAL FIELD

The present invention relates to an optical information read/write apparatus for reading and/or writing data from/on an optical information storage medium.

BACKGROUND ART

Optical disks have become very popular as optical information storage media to read data from, and write data to, by optical techniques. In optical disk technologies, data can be read out from a rotating optical disk by irradiating the disk with a relatively weak light beam with a constant intensity, and detecting the light that has been modulated by, and reflected from, the optical disk.

On a read-only optical disk, information is already stored as pits that are arranged spirally during the manufacturing process of the optical disk. On the other hand, on a rewritable optical disk, a recording material film, from/on which data can be read and written optically, is deposited by an evaporation process, for example, on the surface of a base material on which tracks with spiral lands or grooves are arranged. In writing data on such a rewritable optical disk, data is written there by irradiating the optical disk with a light beam, of which the optical power has been changed according to the data to be written, and locally changing the property of the recording material film.

It should be noted that the depth of the pits, the depth of the tracks, and the thickness of the recording material film are all smaller than the thickness of the optical disk base material. For that reason, those portions of the optical disk, where data is stored, define a two-dimensional plane, which is sometimes called an "information storage plane". However, considering that such an "information storage plane" actually has a physical dimension in the depth direction, too, the term "information storage plane" will be replaced herein by another term "information storage layer". Every optical disk has at least one such information storage layer. Optionally, a single information storage layer may actually include a plurality of layers such as a phase-change material layer and a reflective layer.

To read data that is stored on a recordable optical disk or to write data on such an optical disk, the light beam always needs to maintain a predetermined converging state on a target track on an information storage layer. For that purpose, a "focus control" and a "tracking control" are required. The "focus control" means controlling the position of an objective lens perpendicularly to the information storage layer such that the focus position of the light beam is always located on the information storage layer. On the other hand, the "tracking control" means controlling the position of the objective lens along the radius of a given optical disk such that the light beam spot is always located right on a target track.

Various types of optical disks such as DVD (digital versatile disc)-ROM, DVD-RAM, DVD-RW, DVD-R, DVD+RW and DVD+R have become more and more popular these days as storage media on which a huge amount of information can be stored at a high density. Meanwhile, CDs (compact discs) are still popular now. Currently, next-generation optical disks, including Blu-ray disc (BD), which can store an even greater amount of information at a much higher density, are under development, and some of them have already been put on the market. Furthermore, optical disks with a plurality of information storage layers, which are stacked one upon the other to increase the amount of data that can be stored in a single optical disk, have also been developed.

The light beam to irradiate the information storage layer of an optical disk is emitted from a semiconductor laser diode as a light source. If an optical disk is irradiated with a laser beam emitted from a semiconductor laser diode, then part of the laser beam that has been reflected from the optical disk will enter the semiconductor laser diode. Such a returning beam will decrease the stability of laser beam emission from the semiconductor laser diode, thus increasing noise components in the laser beam intensity and preventing the information stored on the optical disk from being read accurately. This is a problem.

As a means for solving such a returning beam problem, a drive method in which RF current with a frequency of 250 MHz to 350 MHz is superimposed on the drive current for the semiconductor laser diode (which is called an "RF current superimposition method") has been adopted. An optical information read/write apparatus that adopts the RF current superimposition method is disclosed in Patent Documents Nos. 1 and 2, for example.

Patent Document No. 1: Japanese Patent Application Laid-Open Publication No. 07-93794 (see Paragraphs #0016 through #0048 and #0063 through #0065 and FIGS. 1 and 5)
  Patent Document No. 2: Japanese Patent Application Laid-Open Publication No. 07-320292 (see Paragraphs #0035 through #0064 and #0075 through #0094 and FIG. 1)

DISCLOSURE OF INVENTION

Problems to be Solved by the Invention

The superimposition of RF current causes the semiconductor laser diode to operate in multiple modes, thus contributing to reducing the returning beam noise. However, the present inventors discovered and confirmed via experiments that even when such RF current was superimposed, the operating temperature of the semiconductor laser diode rose to eventually increase the read error rate of the optical disk drive. As used herein, the "read error rate" indicates how often read errors occur while data is being read or written by irradiating an optical disk with a laser beam. If the given optical disk is a DVD-R, for example, the read error rate is calculated on a block-by-block basis and is called a "byte error rate (BER)". The increase in read error rate debases the quality of a signal read from an optical disk, which is a serious problem.

In order to overcome the problems described above, a primary object of the present invention is to provide an optical information read/write apparatus that can read data accurately from an optical disk by reducing the noise that would affect the operation of the semiconductor laser diode.

Means for Solving the Problem

An optical information read/write apparatus according to the present invention includes: a laser light source that emits a laser beam to access an information storage medium optically; a driver for supplying drive current to the laser light source; an RF circuit for adding RF superimposed current to the drive current; a temperature sensor for detecting a temperature around the laser light source; and a control section for switching the values of the RF superimposed current according to the temperature detected.

In one preferred embodiment, the control section switches the values of the RF superimposed current in accordance with a temperature-RF superimposed current relation that has been defined in advance by temperature dependence of a parameter representing a read/write characteristic.

In another preferred embodiment, the apparatus further includes a memory that stores the temperature-RF superimposed current relation.

In still another preferred embodiment, the parameter representing the read/write characteristic is a byte error rate.

In this particular preferred embodiment, the control section increases the value of the RF superimposed current such that a variation rate of the parameter, representing the read/write characteristic, with an increase in temperature is reduced to 0.005% or less.

In yet another preferred embodiment, the value of the RF superimposed current is equal to or smaller than an upper limit value that has been set in advance based on the dependence of unwanted radiation noise on the RF superimposed current.

In yet another preferred embodiment, the control section switches the values of the RF superimposed current from a first level I1 into a second level I2 when the temperature detected by the temperature sensor reaches a temperature $T_1$ and from the second level into the first level when the temperature detected by the temperature sensor decreases to a temperature $T_2$, which is lower than the temperature $T_1$ by at least 5° C.

A controller according to the present invention is designed to control an optical information read/write apparatus, which includes: a laser light source that emits a laser beam to access an information storage medium optically; a driver for supplying drive current to the laser light source; an RF circuit for adding RF superimposed current to the drive current; and a temperature sensor for detecting a temperature around the laser light source. The controller includes a memory for storing data that defines a relation between the temperature and the RF superimposed current, and a control section for determining the value of the RF superimposed current in accordance with information about the temperature detected by the temperature sensor and by reference to the data stored in the memory, thereby controlling the operation of the RF circuit. The control section switches the values of the RF superimposed current according to the temperature detected.

EFFECTS OF THE INVENTION

An information read/write apparatus according to the present invention can read and write an information signal from/on an optical disk accurately by reducing the noise that would affect the operation of a semiconductor laser diode.

Figure 1:
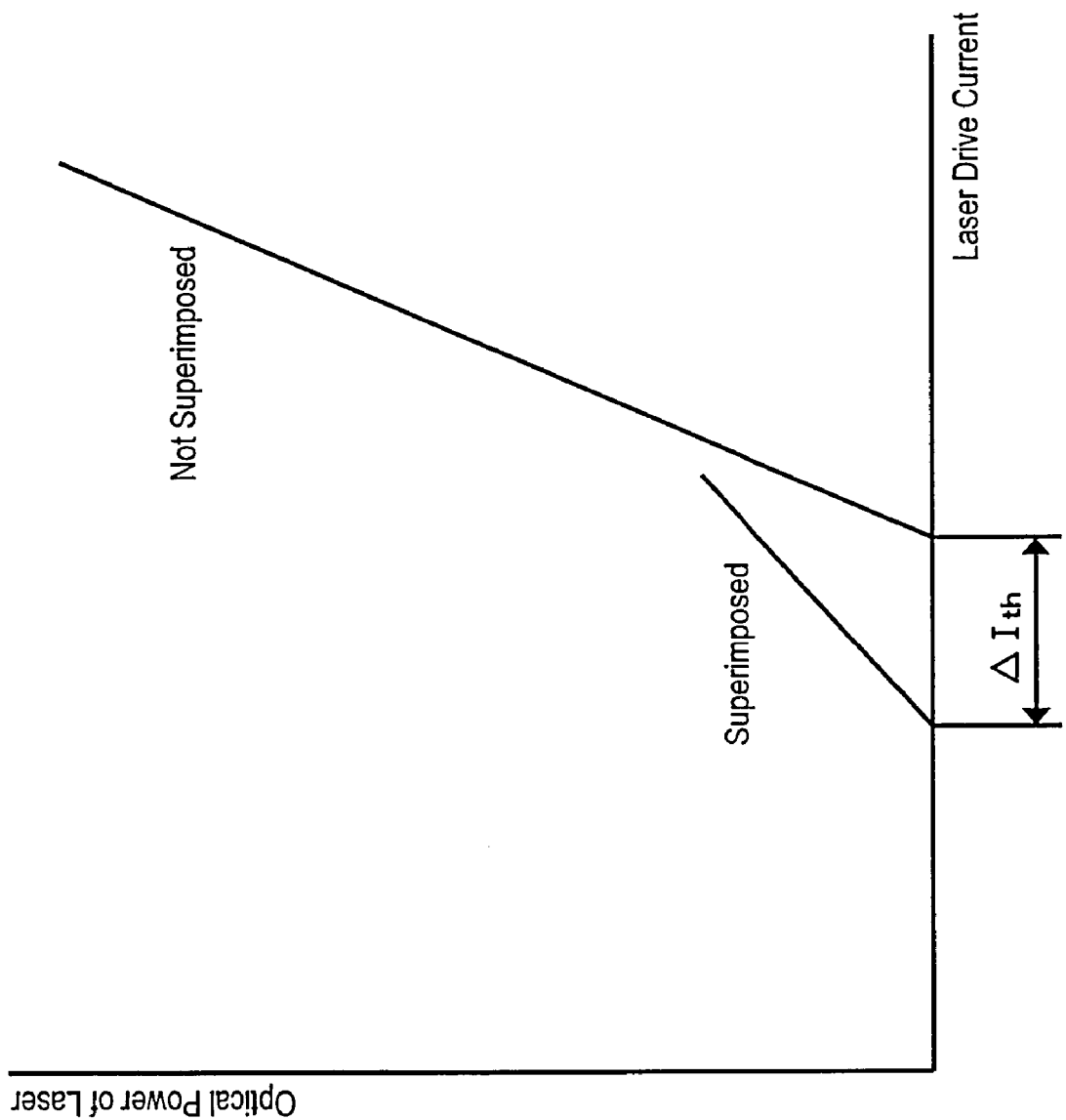
FIG. 1 is a graph showing how the optical power increases with the laser drive current.

DESCRIPTION OF REFERENCE NUMERALS 1 light source
1a laser beam
5 collimator lens
10 reflective mirror
11 objective lens
12 objective lens actuator
13 transport stage
14 photodetector
15 pickup circuit board
16 signal connecting section
30 optical pickup
31 lens holding member
35 temperature sensor
36 preprocessor
37 control section
38 central processing unit (CPU)
39 nonvolatile memory
40 system controller
41 driving section
50 optical disk
51 laser driving section
51a laser driver
51b current amount changing section
51c RF superimposed current generator
52 optical monitor
52a photodiode
52b I/V amplifier
60 optical information read/write apparatus

BEST MODE FOR CARRYING OUT THE INVENTION

The optical information read/write apparatus of the present invention changes the amount of RF current to be superimposed on drive current for a semiconductor laser diode according to the temperature detected by a temperature sensor. The amounts of the RF superimposed current to change according to the temperature are determined in accordance with the correlation between the read/write characteristic of an optical disk and the level of unwanted radiation noise produced by an RF superimposed current generator. According to the present invention, the noise produced by the semiconductor laser diode can be reduced even if the temperature varies, and the unwanted radiation noise can be reduced to within a permissible range defined by standards. As a result, an information signal can be accurately read from, and written on, the optical disk with the increase in unwanted radiation minimized.

First, it will be described with reference to FIGS. 1 through 4 how the temperature of a semiconductor laser diode, the read error rate of an optical disk drive, and the unwanted radiation noise correlate with each other.

Figure 2:
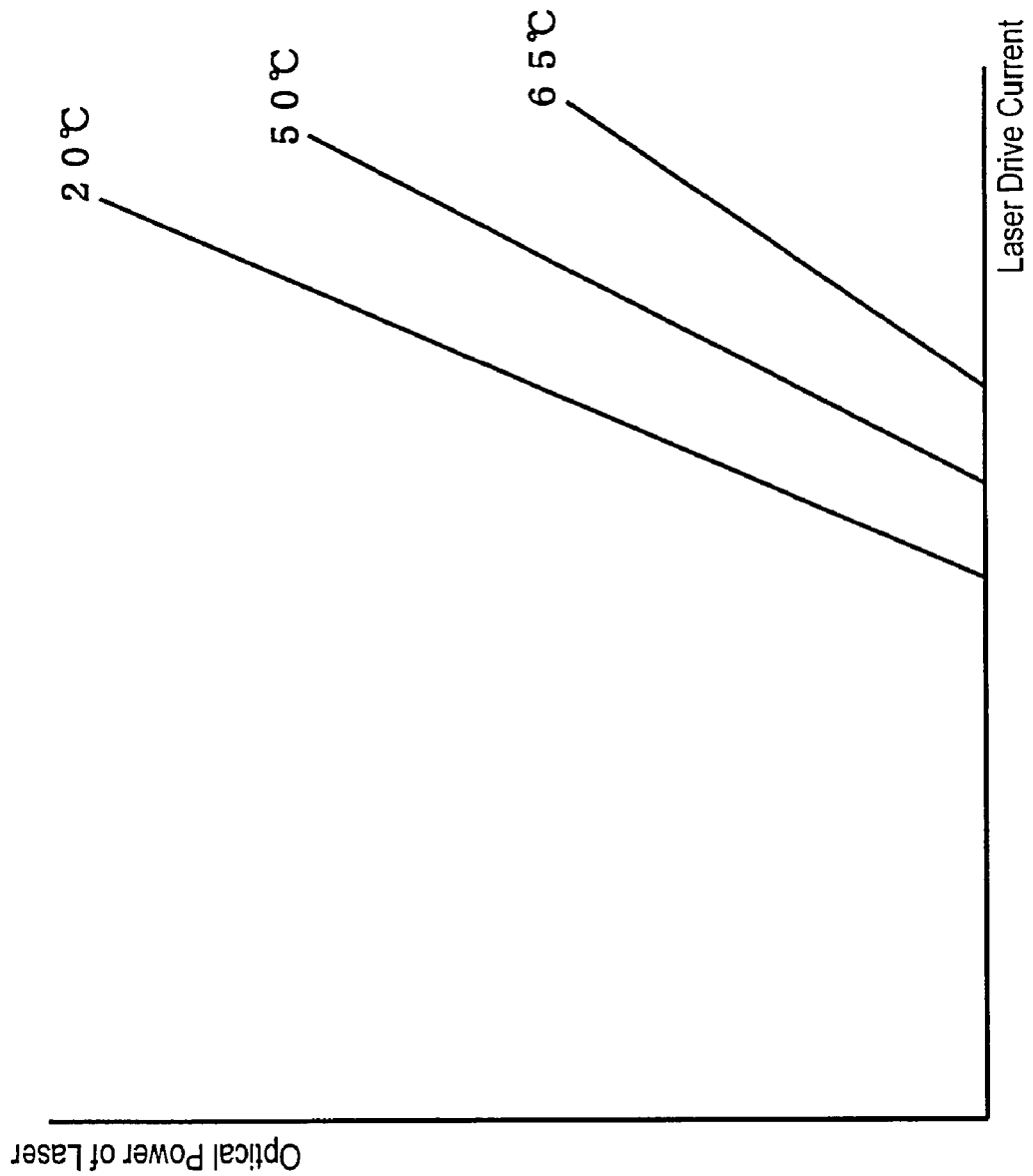
FIG. 2 is a graph showing the temperature dependence of a current-optical power characteristic when RF current is not superimposed.

First, look at FIGS. 1 and 2. FIG. 1 is a graph showing how the optical power increases (i.e., how the optical output characteristic changes) with the laser drive current with and without an RF current (with a frequency of 300 MHz and a current value of 40 mA) superimposed. FIG. 2 is a graph showing the temperature dependence of the optical output characteristic when the RF current is not superimposed.

As shown in FIG. 1, the semiconductor laser diode has a lower emission threshold value when the RF current is superimposed than when no RF current is superimposed. In FIG. 1, the difference between these threshold values is represented by $\Delta I_{th}$. The larger the amount of the RF superimposed current, the greater the threshold value difference $\Delta I_{th}$ and the lower the noise produced by the semiconductor laser diode. In a situation where the semiconductor laser diode is used as a light source for an optical disk drive, as the RF superimposed current increases, the read characteristic is less affected by the returning beam and gets more stabilized.

As shown in FIG. 2, as the operating temperature of the semiconductor laser diode rises, the emission threshold value of the semiconductor laser diode tends to increase, no matter whether the RF current is superimposed or not. Also, as the operating temperature of the semiconductor laser diode rises, the differentiation efficiency decreases, and therefore, the degree of modulation achieved by the RF superimposed current decreases, too. In that case, the read characteristic is affected by the returning beam more easily to increase the read error rate eventually.

Figure 3:
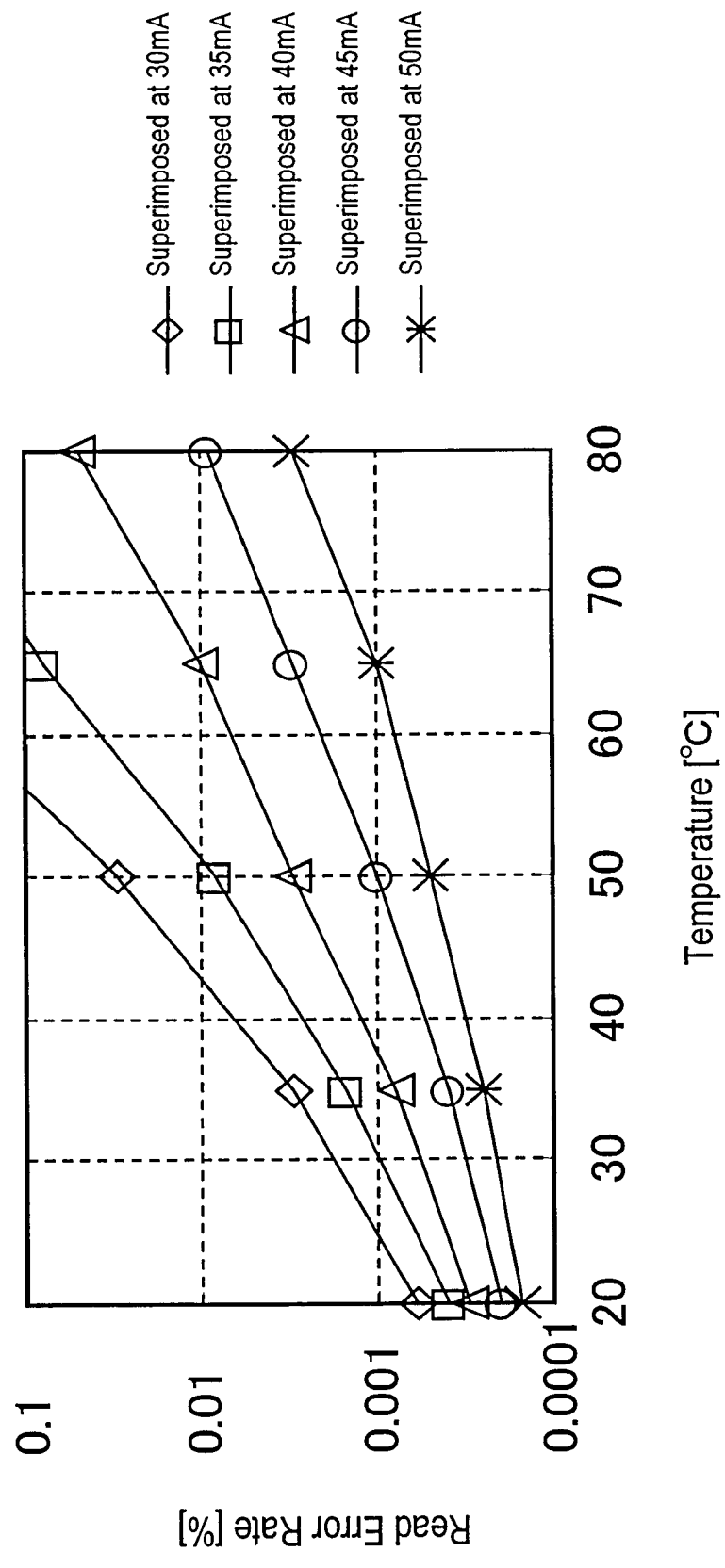
FIG. 3 is a graph showing the temperature dependence of the read error rate in a situation where the amount of the RF superimposed current is changed.

Next, it will be described with reference to FIG. 3 how the read error rate changes with the operating temperature of the semiconductor laser diode. FIG. 3 shows the temperature dependences of the read error rate when the amounts of the RF superimposed current were 30 mA, 35 mA, 40 mA, 45 mA and 50 mA, respectively. If the amount of the RF superimposed current is constant, the read error rate increases with the temperature as shown in FIG. 3. To realize a good read/write characteristic, the read error rate is preferably reduced to 0.01% or less. And to decrease the read error rate, the RF superimposed current may be increased as can be seen from FIG. 3.

However, as the RF superimposed current is increased, the unwanted radiation produced by the RF superimposed current generator increases, too. As is well known, the EMI standard was set by telecommunications committees in various countries around the world. According to the EMI standard, in a situation where an optical information read/write apparatus in operation is arranged with an antenna set 3 m away from the apparatus, for example, if the RF superimposed current supplied to the semiconductor laser diode has a frequency of approximately 250 MHz, the unwanted radiation noise has a conduction limit value of 46 dB.

Figure 4:
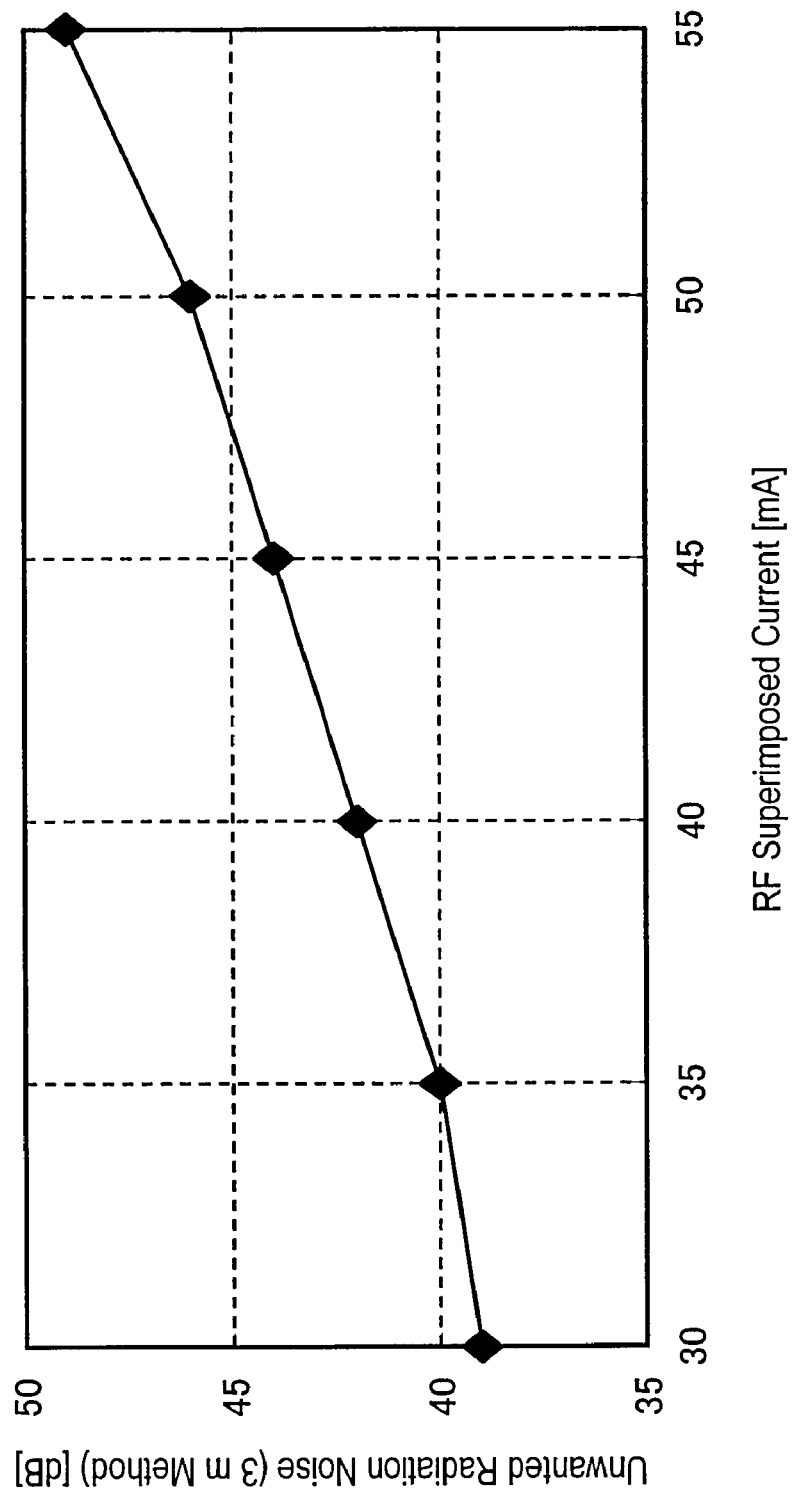
FIG. 4 is a graph showing how the unwanted radiation noise changes with the RF superimposed current.

FIG. 4 is a graph showing how the unwanted radiation noise changes with the RF superimposed current in an optical disk drive. As can be seen from FIG. 4, as the RF superimposed current increases, the unwanted radiation noise increases, too. That is why if the RF superimposed current is simply increased to reduce the read error rate, then unwanted radiation noise will soon be produced to a level that exceeds the permissible range defined by the EMI standard. In the example shown in FIG. 4, if the RF superimposed current exceeds 50 mA, the unwanted radiation noise increases to reach 46 dB and go beyond the permissible range defined by the EMI standard.

According to the present invention, if the temperature of the semiconductor laser diode has increased to reach such a level as causing the read error rate to exceed a predetermined value (of 0.01%, for example), the increase in read error rate is minimized by increasing the amount of the RF superimposed current. In that case, however, the RF superimposed current is increased to such a degree as to prevent the level of the unwanted radiation noise from going beyond the range defined by the EMI standard.

More specifically, for that purpose, not just the correlation between the read/write characteristic (represented by the read error rate) and the temperature is analyzed in advance with the RF superimposed current varied but also the relation between the level of the unwanted radiation noise and the RF superimposed current is monitored beforehand. Then, the relation between the temperature of the semiconductor laser diode and the RF superimposed current is stored as a table in the apparatus such that the values of the RF superimposed current are changed according to the temperature of the semiconductor laser diode detected during the operation. For example, after the optical information read/write apparatus has just started to operate (i.e., when the temperature of the semiconductor laser diode is still relatively low), the RF superimposed current may have a value of 40 mA. Thereafter, when the temperature of the semiconductor laser diode increases to reach 65° C., the values of the RF superimposed current are changed from 40 mA into 45 mA.

To change the amounts of the RF superimposed current in this manner, the relation between the temperature and the RF superimposed current needs to be stored in a nonvolatile memory. Then, according to the temperature detected by a temperature sensor, the amount of the RF superimposed current generated by the RF superimposed current generator may be switched by a current amount changing section.

Embodiment 1

Hereinafter, preferred embodiments of an optical information read/write apparatus according to the present invention will be described with reference to the accompanying drawings.

Figure 5:
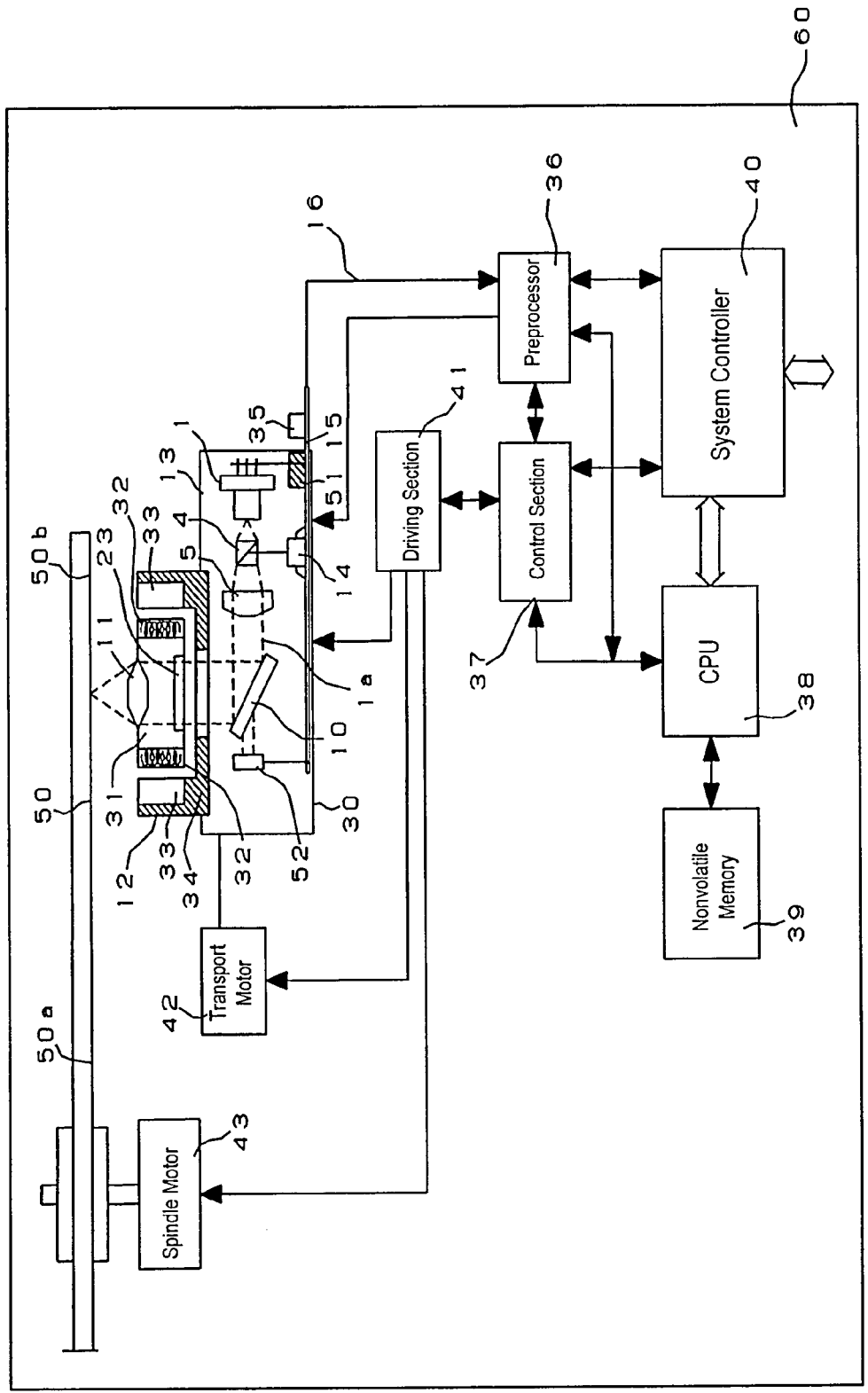
FIG. 5 shows the configuration of an optical information read/write apparatus according to a preferred embodiment of the present invention.
Figure 6:
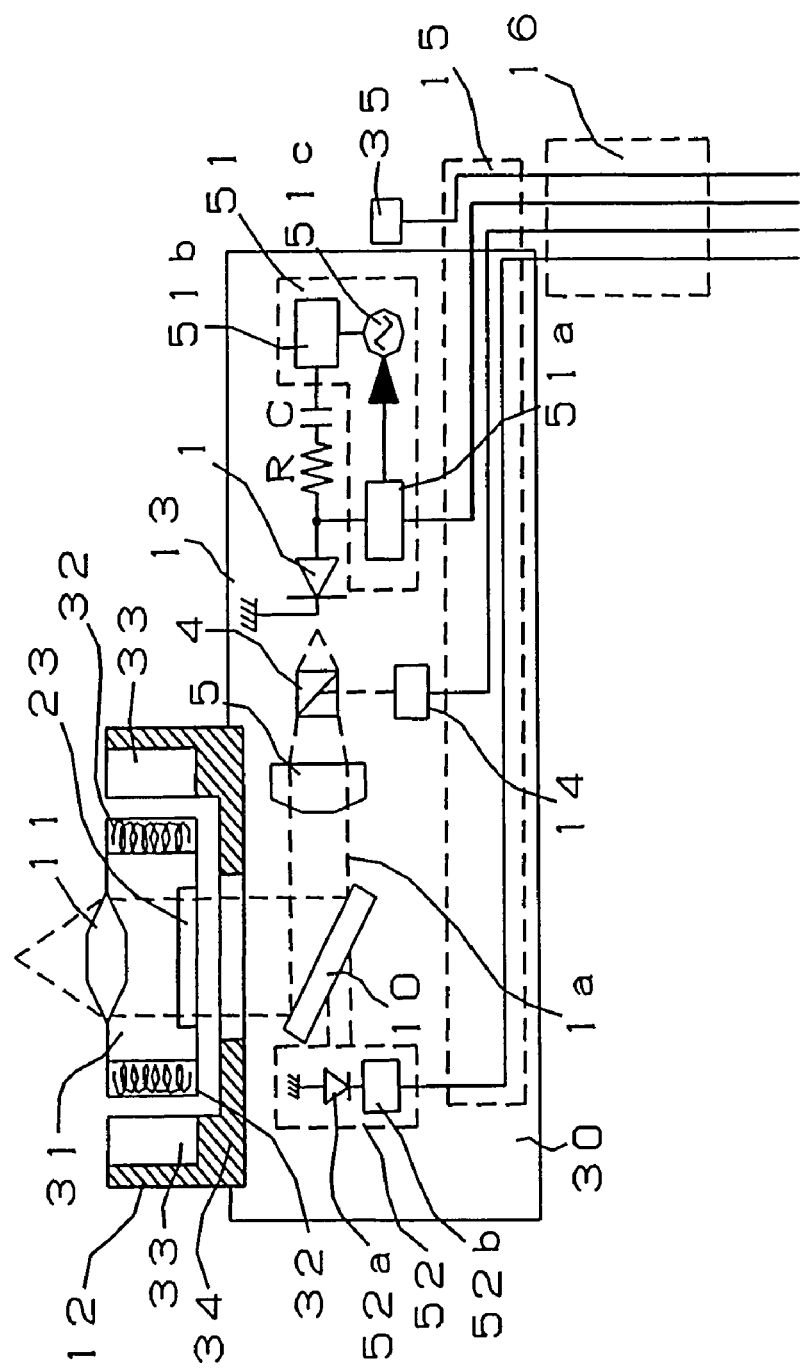
FIG. 6 shows the circuit configuration of the major section of the optical information read/write apparatus shown in FIG. 5.

First, referring to FIGS. 5 and 6, shown are the configuration of an optical information read/write apparatus according to a preferred embodiment of the present invention and an exemplary circuit configuration of the major section thereof, respectively.

As shown in FIG. 5, the optical information read/write apparatus of this preferred embodiment includes a spindle motor 43 for spinning an optical disk 50, an optical pickup 30 for accessing the optical disk 50 optically, and a signal processing section that is electrically connected to the optical pickup.

The optical pickup 30 includes a light source 1, which may be a semiconductor laser diode, a laser driving section 51, an optical system for condensing the laser beam, emitted from the light source 1, on the optical disk 50, and a photodetector that receives a portion of the laser beam that has been reflected from the optical disk 50 to generate an electrical signal. In this preferred embodiment, a temperature sensor 35 for detecting the temperature around the light source 1 is arranged near the light source 1 and mounted on a pickup circuit board 15 to detect the temperature of the semiconductor laser diode (light source 1) accurately.

As shown in FIG. 6, the laser driving section 51 includes a laser driver 51a for supplying drive current to the semiconductor laser diode as the light source 1, an RF superimposed current generator 51c for generating and adding RF superimposed current (with a frequency of 250 MHz to 350 MHz, for example) to the drive current supplied from the laser driving section 51, and a current amount changing section 51b that can switch the amount of the RF superimposed current in multiple stages (in the range of 30 mA to 50 mA). The laser driving section 51 is mounted on the pickup circuit board 15 as shown in FIG. 1.

As shown in FIG. 6, the optical pickup 30 includes: a collimator lens 5 that transforms the laser beam 1a, emitted from the light source 1, into a parallel beam; a reflective mirror 10 for reflecting the parallel laser beam 1a perpendicularly to the optical disk 50; an optical monitor 52 for detecting the intensity of the laser beam emitted from the light source 1;

an objective lens 11 that condenses the laser beam 1a to form a light beam spot on the information storage layer of the optical disk 50; an optical element 23 for changing the optical path of the light reflected from the optical disk 50 into that leading to the light source 1; and a photodetector 14 for transforming the light reflected from the optical disk 50 into an electrical signal.

The collimator lens 5 and the reflective mirror 10 are arranged at predetermined locations on a transport stage 13. The optical monitor 52 includes a photodiode 52a and an I/V amplifier 52b and is arranged where the laser beam 1a is transmitted through the reflective mirror 10. The objective lens 11 and the optical element 23 are held on a lens holding member 31. And the photodetector 14 is arranged on the transport stage 13 at the best location to detect the reflected light.

The light source 1, objective lens actuator 12 and photodetector 14 are connected to the pickup circuit board 15 by way of a flexible printed wiring board (not shown) or any other connection means. The pickup circuit board 15 includes resistors, capacitors and other electric components that have been assembled together thereon, and is connected to a signal connecting section 16 such as a flexible printed wiring board.

The information stored on the optical disk 50 is transformed into an electrical signal by the photodetector 14 of the optical pickup 30. This electrical signal is input to a preprocessor 36 by way of the pickup circuit board 15 and the signal connecting section 16. The preprocessor 36 not only generates servo signals such as a focus error signal and a tracking error signal but also performs various types of analog signal processing including read signal waveform equalization, digitization/slicing and synchronous data generation.

The servo signals generated by the preprocessor 36 are supplied to the control section 37, which drives the objective lens actuator 12 and a transport motor 42 that transports the optical pickup 30 toward the inner or outer edge of the optical disk 50. The driving section 41 controls the operation of the objective lens actuator 12 such that the light beam spot formed by the optical pickup 30 on the information storage layer of the optical disk 50 follows a desired track, and performs a focus control, a tracking control, a transport control and a spindle motor control. These series of controls are realized as a digital servo by the control section 37.

The synchronous data generated by the preprocessor 36 is subjected to digital signal processing by a system controller 40 and the read/write data is transferred to a host by way of an interface circuit (not shown). The preprocessor 36, the control section 37 and system controller 40 are connected to the CPU 38 and operate in accordance with the instructions given by the CPU 28.

The laser light intensity information detected by the optical monitor 52 is also input to the preprocessor 36 by way of the pickup circuit board 15 and the signal connecting section 16. In accordance with the instruction given by the CPU 38, the laser driving section 51 operates to make the laser power for reading and writing data constant by APC. Since the laser power for writing data on the optical disk 50 changes with the number of revolutions of the spindle motor 43, the laser driving section 51 controls the laser power with the number of revolutions taken into account.

A program that defines a series of operations to be performed by the optical disk drive, including spinning the optical disk 50, transporting the optical pickup 30 to a target position, and forming a light beam spot on the target track on the optical disk 50 and scanning the track with the light beam spot, is stored in advance as firmware in a nonvolatile memory 39.

According to this preferred embodiment, the increase in read error rate due to the rise in the temperature of the semiconductor laser diode can be minimized, while at the same time, the unwanted radiation noise can be reduced to within the permissible range defined by the EMI standard. As a result, an information signal can be read accurately from the optical disk.

Figure 7:
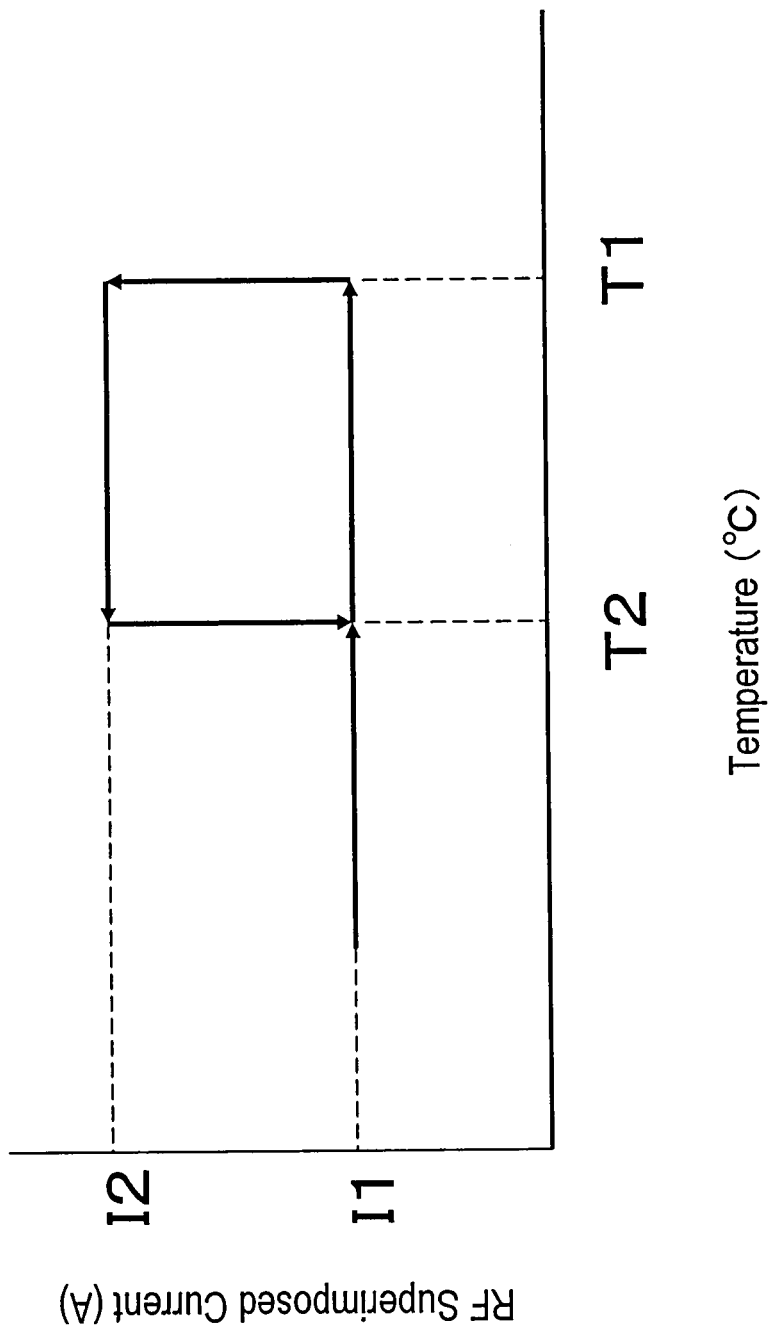
FIG. 7 shows how the values of the RF superimposed current are switched according to the temperature measured in a preferred embodiment of the present invention.

FIG. 7 is a graph showing how the values of the RF superimposed current are switched according to the temperature measured. In this preferred embodiment, until the temperature measured reaches a temperature $T_1$ (of 60° C., for example), the RF superimposed current is maintained at a first value $I_1$ (of 40 mA, for example). Thereafter, when the temperature measured reaches a temperature $T_1$, the current amount changing section 51b switches the values of the RF superimposed current from the first value $I_1$, into a second value $I_2$ (of 45 mA, for example). The second value $I_2$ is determined in advance based on the correlations among the temperature, the read error rate, the RF superimposed current and the unwanted radiation noise as shown in FIGS. 3 and 4.

In this preferred embodiment, even if the temperature measured decreases from the temperature $T_1$, the values of the RF superimposed current are not immediately switched from the second value $I_2$ into the first value $I_1$. Instead, according to this preferred embodiment, when the temperature measured decreases to a temperature $T_2$ that is much lower than the temperature $T_1$, the current amount changing section 51b switches the values of the RF superimposed current from the second value $I_2$ into the first value $I_1$, as shown in FIG. 7. This delayed switching is adopted so as not to change the values of the RF superimposed current so frequently responsive to a slight temperature variation. For that purpose, the temperature difference $T_1-T_2$ is preferably at least equal to 5° C., and may even be 10° C. or more.

In this preferred embodiment, if the apparatus is operated at a temperature of 50° C. with an RF superimposed current of the first value $I_1$ (e.g., 40 mA) supplied, the spindle motor 43, transport motor 42 and other members generate heat to increase the temperature. And when the temperature measured reaches the temperature $T_1$ (of 65° C., for example), the values of the RF superimposed current are switched into the second value $I_2$ (e.g., 45 mA). Thereafter, the temperature measured enters a steady state around 65° C. and the amounts of the RF superimposed current are not changed even if a slight temperature variation of −1° C. to +1° C. has occurred.

As can be seen from FIG. 3, if the RF superimposed current is always maintained at 40 mA, the read error rate reaches 0.01% at a temperature of 65° C. However, if the values of the RF superimposed current are switched into 45 mA, the read error rate at 65° C. can be reduced to a half or less. In addition, with the RF superimposed current of 45 mA, the unwanted radiation noise can also be reduced to less than 45 dB.

In the preferred embodiment described above, the values of the RF superimposed current are switched in two stages. However, according to the present invention, the current values do not have to be switched in two stages but may be switched in three or more stages or even varied continuously according to the temperature.

Also, the amount of the RF superimposed current to be determined by the temperature measured does not have to be fixed at a particular value. In the example described above, the value $I_2$ of the RF superimposed current at 65° C. is supposed to be 45 mA. Alternatively, the value $I_2$ may also be changed according to the type of the optical disk to read data from or write data to or the amount of time in which the semiconductor laser diode has been activated continuously.

The temperature sensor of the present invention only needs to detect a temperature variation of the semiconductor laser diode and does not have to measure the temperature of the semiconductor laser diode itself accurately. That is to say, the temperature sensor has only to detect the temperature of a portion, which is affected by a temperature variation of the semiconductor laser diode, either directly or indirectly. That is why "to detect the temperature of a laser light source" means herein sensing any temperature variation that may influence the characteristic of the laser light source. The temperature sensor is preferably arranged somewhere on the optical pickup. However, the temperature sensor may also be replaced with an infrared sensor that is attached to some member other than the optical pickup. Furthermore, the temperature sensor does not have to include an element that responds directly to a temperature variation. For example, if the temperature can be estimated, or information about the temperature can be collected, based on the relation between the drive current and the optical power, an element or a circuit that functions for that purpose may also be broadly referred to herein as a "temperature sensor" according to the definition of the present invention.

INDUSTRIAL APPLICABILITY

The optical information read/write apparatus of the present invention can be used extensively in numerous types of electronic devices for storing various sorts of data including audiovisual information.

The invention claimed is:

1. An optical disk drive comprising:
a laser light source that emits a laser beam to access an information storage medium optically;
a driver for supplying drive current to the laser light source;
an RF circuit for adding RF superimposed current to the drive current;
a temperature sensor for detecting a temperature around the laser light source; and
a control section for switching the values of the RF superimposed current according to the temperature detected,
wherein under a condition where the values of the RF superimposed current is at a first level I1, the control section increases the values of the RF superimposed current from the first level I1 into a second level I2 when the temperature detected by the temperature sensor reaches a temperature T1 from a temperature that is lower than the temperature T1, and under a condition where the values of the RF superimposed current is at the second level I2, the control section decreases the values of the RF superimposed current from the second level I2 into the first level I1 when the temperature detected by the temperature sensor decreases to a temperature T2 that is lower than the temperature T1.

2. The optical disk drive of claim 1, wherein the control section switches the values of the RF superimposed current in accordance with a temperature-RF superimposed current relation that has been defined in advance by temperature dependence of a parameter representing a read/write characteristic.

3. The optical disk drive of claim 2, further comprising a memory that stores the temperature-RF superimposed current relation.

4. The optical disk drive of claim 2, wherein the parameter representing the read/write characteristic is a byte error rate.

5. The optical disk drive of claim 4, wherein the control section increases the value of the RF superimposed current such that a variation rate of the parameter, representing the read/write characteristic, with an increase in temperature is reduced to 0.005% or less.

6. The optical disk drive of claim 1, wherein the value of the RF superimposed current is equal to or smaller than an upper limit value that has been set in advance based on the dependence of unwanted radiation noise on the RF superimposed current.

7. The optical disk drive of claim 1, wherein the temperature $T_2$ is lower than the temperature $T_1$ by at least 5° C.

8. A controller for controlling an optical disk drive, the apparatus including: a laser light source that emits a laser beam to access an information storage medium optically; a driver for supplying drive current to the laser light source; an RF circuit for adding RF superimposed current to the drive current; and a temperature sensor for detecting a temperature around the laser light source,
the controller comprising
a memory for storing data that defines a relation between the temperature and the RF superimposed current, and
a control section for determining the value of the RF superimposed current in accordance with information about the temperature detected by the temperature sensor and by reference to the data stored in the memory, thereby controlling the operation of the RF circuit,
wherein the control section switches the values of the RF superimposed current according to the temperature detected, and
wherein under a condition where the values of the RF superimposed current is at a first level I1, the control section increases the values of the RF superimposed current from the first level I1 into a second level I2 when the temperature detected by the temperature sensor reaches a temperature T1 from a temperature that is lower than the temperature T1, and under a condition where the values of the RF superimposed current is at the second level I2, the control section decreases the values of the RF superimposed current from the second level I2 into the first level I1 when the temperature detected by the temperature sensor decreases to a temperature T2 that is lower than the temperature T1.

9. The controller of claim 8, wherein the control section switches the values of the RF superimposed current in accordance with a temperature-RF superimposed current relation that has been defined in advance by temperature dependence of a byte error rate.

* * * * *